(12) United States Patent
Park et al.

(10) Patent No.: US 7,652,424 B2
(45) Date of Patent: Jan. 26, 2010

(54) ORGANIC LIGHT EMITTING DEVICE (75) Inventors: Sangtae Park, Seoul (KR); Myungseop Kim, Seoul (KR); Jeongdae Seo, Seoul (KR); Wonjae Yang, Seoul (KR); Hyunju Choi, Seoul (KR); Younghoon Shin, Seoul (KR); Changho Hyeon, Seoul (KR); Jongmoo Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 189 days.

(21) Appl. No.: 12/015,099

(22) Filed: Jan. 16, 2008

(65) Prior Publication Data
US 2009/0001877 A1    Jan. 1, 2009

(30) Foreign Application Priority Data
Jun. 26, 2007    (KR)    ............... 10-2007-0063073

(51) Int. Cl.
*H05B 33/00*    (2006.01)

(52) U.S. Cl. ........................... 313/512; 313/504

(58) Field of Classification Search ............... None
See application file for complete search history.

(56) References Cited

U.S. PATENT DOCUMENTS

| 7,019,455 B2 * | 3/2006 | Fukuoka et al. ........... 313/504 |
| 7,560,858 B2 * | 7/2009 | Nishikawa et al. ......... 313/292 |
| 2005/0052125 A1 * | 3/2005 | Moriyama et al. ........ 313/504 |

* cited by examiner

*Primary Examiner*—Ashok Patel
(74) *Attorney, Agent, or Firm*—Ked & Associates, LLP (57) ABSTRACT

An organic light emitting device is disclosed. The organic light emitting device includes a first substrate, a display unit that is positioned on the first substrate and includes a plurality of subpixels, a second substrate facing the first substrate, a seal member attaching the first substrate to the second substrate, and at least one projection. The seal member substantially has a water vapor permeation rate of $10^0$ g/m² day to $10^3$ g/m² day. The projection is positioned at a location corresponding to a bezel area of at least one of the first and second substrates.

15 Claims, 11 Drawing Sheets

ORGANIC LIGHT EMITTING DEVICE

This application claims the benefit of Korean Patent Application No. 10-2007-0063073 filed on Jun. 26, 2007, which is hereby incorporated by reference.

BACKGROUND

1. Field

An exemplary embodiment relates to a display device, and more particularly, to an organic light emitting device.

2. Description of the Related Art

An organic light emitting device is a self-emitting device including a light emitting layer between two electrodes.

The organic light emitting device may have a top emission structure and a bottom emission structure depending on an emission direction of light. The organic light emitting device may be classified into a passive matrix type organic light emitting device and an active matrix type organic light emitting device depending on a driving manner.

However, the organic light emitting device may be easily degraded by an inner factor such as a degradation of a cathode electrode due to oxygen, a degradation of a reaction between the light emitting layer and an interface, and an external factor such as moisture, oxygen, ultraviolet rays, and product conditions. In particular, since moisture and oxygen permeated from outside have fatal influence on life span of the organic light emitting device, a sealing process in the organic light emitting device is very important.

In case of the organic light emitting device using a flexible substrate such as stainless steel or plastic film which has been recently developed, a sealing process is not perfect. In case of using a stainless steel substrate, the organic light emitting device has a top emission structure in which visible light is emitted toward the substrate. Therefore, a protective layer used in a sealing process has to be transparent. Further, the protective layer has to have a very small wafer vapor permeation rate so as to prevent the degradation of the organic light emitting device due to moisture or oxygen permeated from outside. A seal member used in the sealing process has to be thin.

Accordingly, it is very necessary to find a way capable of perfectly protecting elements formed on the substrate of the organic light emitting device.

SUMMARY

An exemplary embodiment provides an organic light emitting device capable of increasing life span and reliability.

In one aspect, an organic light emitting device comprises a first substrate, a display unit on the first substrate, the display unit including a plurality of subpixels, a second substrate positioned to face the first substrate, a seal member that attaches the first substrate to the second substrate, the seal member substantially having a water vapor permeation rate of $10^0$ g/m² day to $10^3$ g/m² day, and at least one projection positioned at a location corresponding to a bezel area of at least one of the first substrate and the second substrate.

BRIEF DESCRIPTION OF THE DRAWINGS

The accompanying drawings, which are included to provide a further understanding of the invention and are incorporated on and constitute a part of this specification, illustrate embodiments of the invention and together with the description serve to explain the principles of the invention. In the drawings.

DETAILED DESCRIPTION

Reference will now be made in detail embodiments of the invention examples of which are illustrated in the accompanying drawings.

Figure 1:
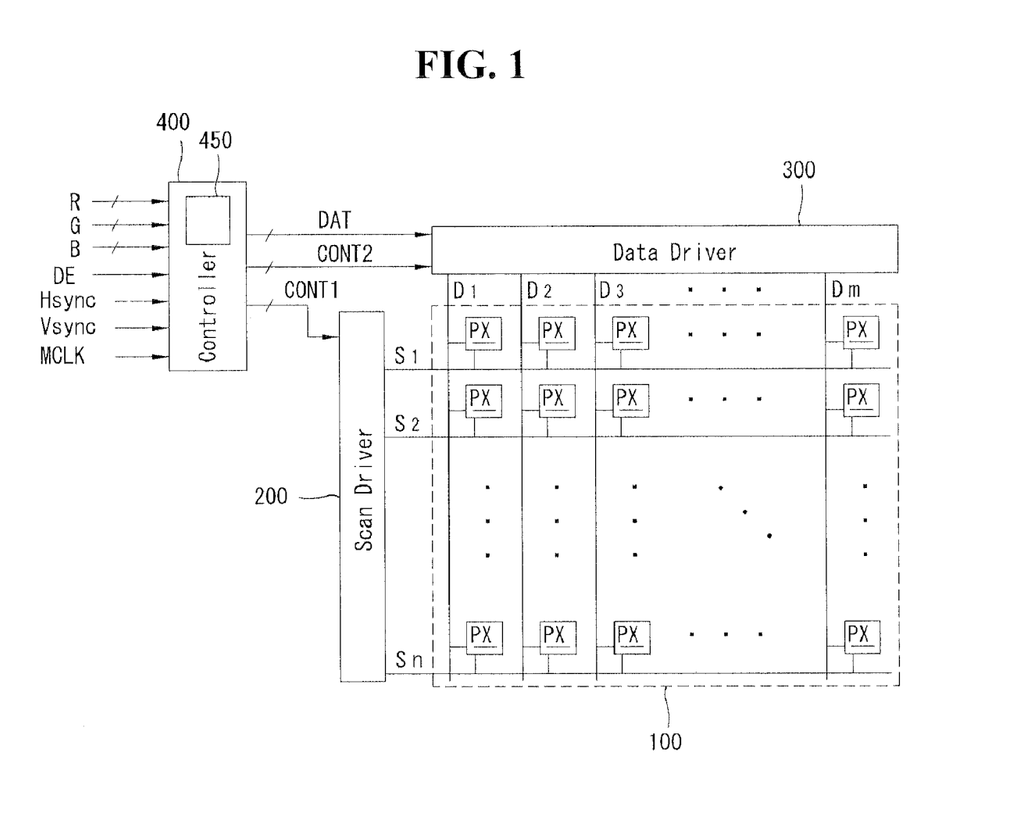
FIG. 1 is a bock diagram of an organic light emitting device according to an exemplary embodiment.
Figure 2A:
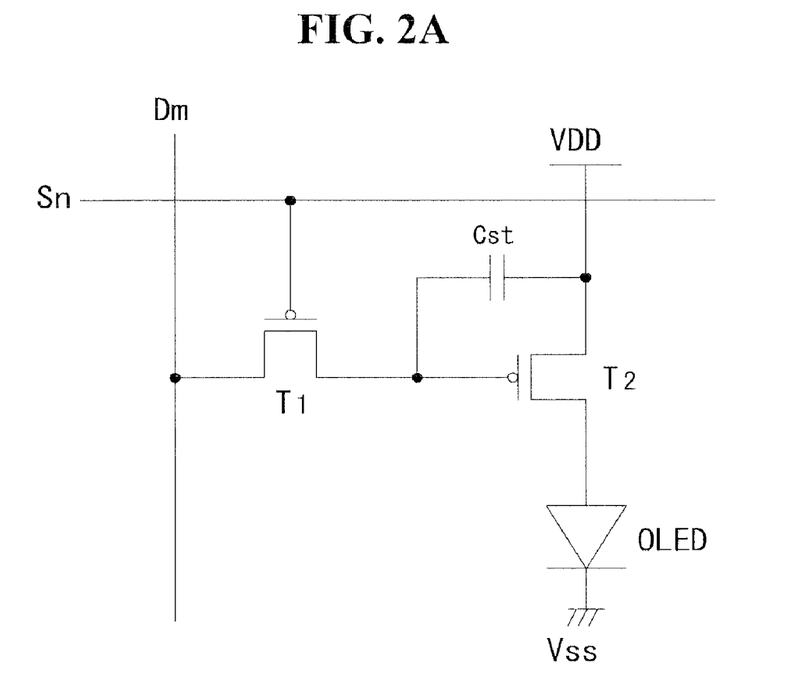
FIGS. 2A and 2B are circuit diagrams of a subpixel of the organic light emitting device.
Figure 2B:
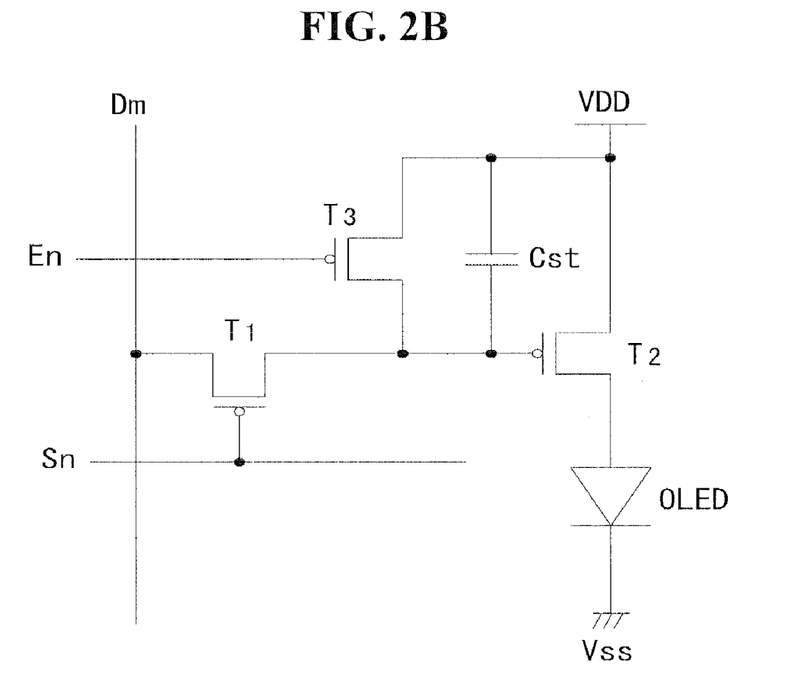

FIG. 1 is a bock diagram of an organic light emitting device according to an exemplary embodiment, and FIGS. 2A and 2B are circuit diagrams of a subpixel of the organic light emitting device.

As shown in FIG. 1, the organic light emitting device according to the exemplary embodiment includes a display panel 100, a scan driver 200, a data driver 300, and a controller 400.

The display panel 100 includes a plurality of signal lines S1 to Sn and D1 to Dm, a plurality of power supply lines (not shown), and a plurality of subpixels PX arranged in a matrix format to be connected to the signal lines S1 to Sn and D1 to Dm and the power supply lines.

The plurality of signal lines S1 to Sn and D1 to Dm may include the plurality of scan lines S1 to Sn for transmitting scan signals and the plurality of data lines D1 to Dm for transmitting data signals. Each power supply line may transmit voltages such as a power voltage VDD to each subpixel PX.

Although the signal lines include the scan lines S1 to Sn and the data lines D1 to Dm in FIG. 1, the exemplary embodiment is not limited thereto. The signal lines may further include erase lines (not shown) for transmitting erase signals depending on a driving manner.

However, the erase lines may not be used to transmit the erase signals. The erase signal may be transmitted through another signal line. For instance, although it is not shown, the erase signal may be supplied to the display panel 100 through the power supply line in case that the power supply line for supplying the power voltage VDD is formed.

As shown in FIG. 2A, the subpixel PX may include a switching thin film transistor T1 transmitting a data signal in response to a scan signal transmitted through the scan line Sn, a capacitor Cst storing the data signal, a driving thin film transistor T2 producing a driving current corresponding to a voltage difference between the data signal stored in the capacitor Cst and the power voltage VDD, and a light emitting diode (OLED) emitting light corresponding to the driving current.

As shown in FIG. 2B, the subpixel PX may include a switching thin film transistor T1 transmitting a data signal in response to a scan signal transmitted through the scan line Sn, a capacitor Cst storing the data signal, a driving thin film transistor T2 producing a driving current corresponding to a voltage difference between the data signal stored in the capacitor Cst and the power voltage VDD, a light emitting diode (OLED) emitting light corresponding to the driving current, and an erase switching thin film transistor T3 erasing the data signal stored in the capacitor Cst in response to an erase signal transmitted through an erase line En.

When the display device is driven in a digital driving manner that represents a gray scale by dividing one frame into a plurality of subfields, the pixel circuit of FIG. 2B can control a light emitting time by supplying the erase signal to the subfield PX whose the light-emission time is shorter than an addressing time. The pixel circuit of FIG. 2B has an advantage capable of reducing a minimum luminance of the display device.

A difference between driving voltages, e.g., the power voltages VDD and Vss of the organic light emitting device may change depending on the size of the display panel 100 and a driving manner. A magnitude of the driving voltage is shown in the following Tables 1 and 2. Table 1 indicates a driving voltage magnitude in case of a digital driving manner, and Table 2 indicates a driving voltage magnitude in case of an analog driving manner.

TABLE 1

| Size (S) of display panel | VDD-Vss (R) | VDD-Vss (G) | VDD-Vss (B) |
|---|---|---|---|
| S < 3 inches | 3.5-10 (V) | 3.5-10 (V) | 3.5-12 (V) |
| 3 inches < S < 20 inches | 5-15 (V) | 5-15 (V) | 5-20 (V) |
| 20 inches < S | 5-20 (V) | 5-20 (V) | 5-25 (V) |

TABLE 2

| Size (S) of display panel | VDD-Vss (R, G, B) |
|---|---|
| S < 3 inches | 4~20 (V) |
| 3 inches < S < 20 inches | 5~25 (V) |
| 20 inches < S | 5~30 (V) |

Referring again to FIG. 1, the scan driver 200 is connected to the scan lines S1 to Sn to apply scan signals capable of turning on the switching thin film transistor T1 to the scan lines S1 to Sn, respectively.

The data driver 300 is connected to the data lines D1 to Dm to apply data signals indicating an output video signal DAT' to the data lines D1 to Dm, respectively. The data driver 300 may include at least one data driving integrated circuit (IC) connected to the data lines D1 to Dm.

The data driving IC may include a shift register, a latch, a digital-to-analog (DA) converter, and an output buffer which are connected to one another in the order named.

When a horizontal sync start signal (STH) (or a shift clock signal) is received, the shift register can transmit the output video signal DAT' to the latch in response to a data clock signal (HLCK). In case that the data driver 300 includes a plurality of data shift register of a next data driving IC.

The latch memorizes the output video signal DAT', selects a gray voltage corresponding to the memorized output video signal DAT' in response to a load signal, and transmits the gray voltage to the output buffer.

The DA converter selects the corresponding gray voltage in response to the output video signal DAT' and transmits the gray voltage to the output buffer.

The output buffer outputs an output voltage (serving as a data signal) received from the DA converter to the data lines D1 to Dm, and maintains the output of the output voltage for 1 horizontal period (1H).

The controller 400 controls operations of the scan driver 200 and the data driver 300. The controller 400 may include a signal conversion unit 450 that gamma-converts input video signals R, G and B into the output video signal DAT' and produces the output video signal DAT'.

The controller 400 produces a scan control signal CONT1 and a data control signal CONT2, and the like. Then, the controller 400 outputs the scan control signal CONT1 to the scan driver 200 and outputs the data control signal CONT2 and the processed output video signal DAT' to the data driver 300.

The controller 400 receives the input video signals R, G and B and an input control signal for controlling the display of the input video signals R, G and B from a graphic controller (not shown) positioned outside the organic light emitting device. Examples of the input control signal include a vertical sync signal Vsync, a horizontal sync signal Hsync, a main clock signal MCLK and a data enable signal DE.

Each of the driving devices 200, 300 and 400 may be directly mounted on the display panel 100 in the form of at least one IC chip, or may be attached to the display panel 100 in the form of a tape carrier package (TCP) in a state where the driving devices 200, 300 and 400 each are mounted on a flexible printed circuit film (not shown), or may be mounted on a separate printed circuit board (not shown). Alternatively, each of the driving devices 200, 300 and 400 may be integrated on the display panel 100 together with elements such as the plurality of signal lines S1 to Sn and D1 to Dm or the thin film transistors T1, T2 and T3.

Further, the driving devices 200, 300 and 400 may be integrated into a single chip. In this case, at least one of the driving devices 200, 300 and 400 or at least one circuit element constituting the driving devices 200, 300 and 400 may be positioned outside the single chip.

Figure 3:
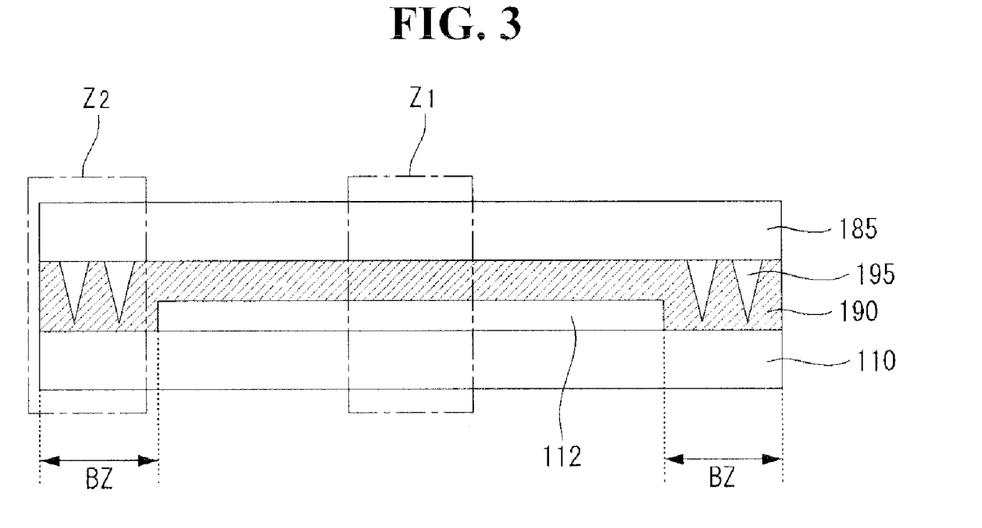
FIG. 3 is a cross-sectional view of an organic light emitting device according to a first exemplary embodiment.

FIG. 3 is a cross-sectional view of an organic light emitting device according to a first exemplary embodiment.

As shown in FIG. 3, the organic light emitting device according to the first exemplary embodiment includes a first substrate 110, and a display unit 112 including a plurality of pixels 112 arranged in a matrix format on the first substrate 110. The display unit 112 may be classified into a passive matrix type display unit or an active matrix type display unit. In case of the active matrix type display unit, the display unit 112 includes a transistor array on the first substrate 110.

In the present invention, a structure of a subpixel of the active matrix type display unit 112 as an example of the display unit will be now described in detail with reference to FIGS. 4A and 4B.

Figure 4A:
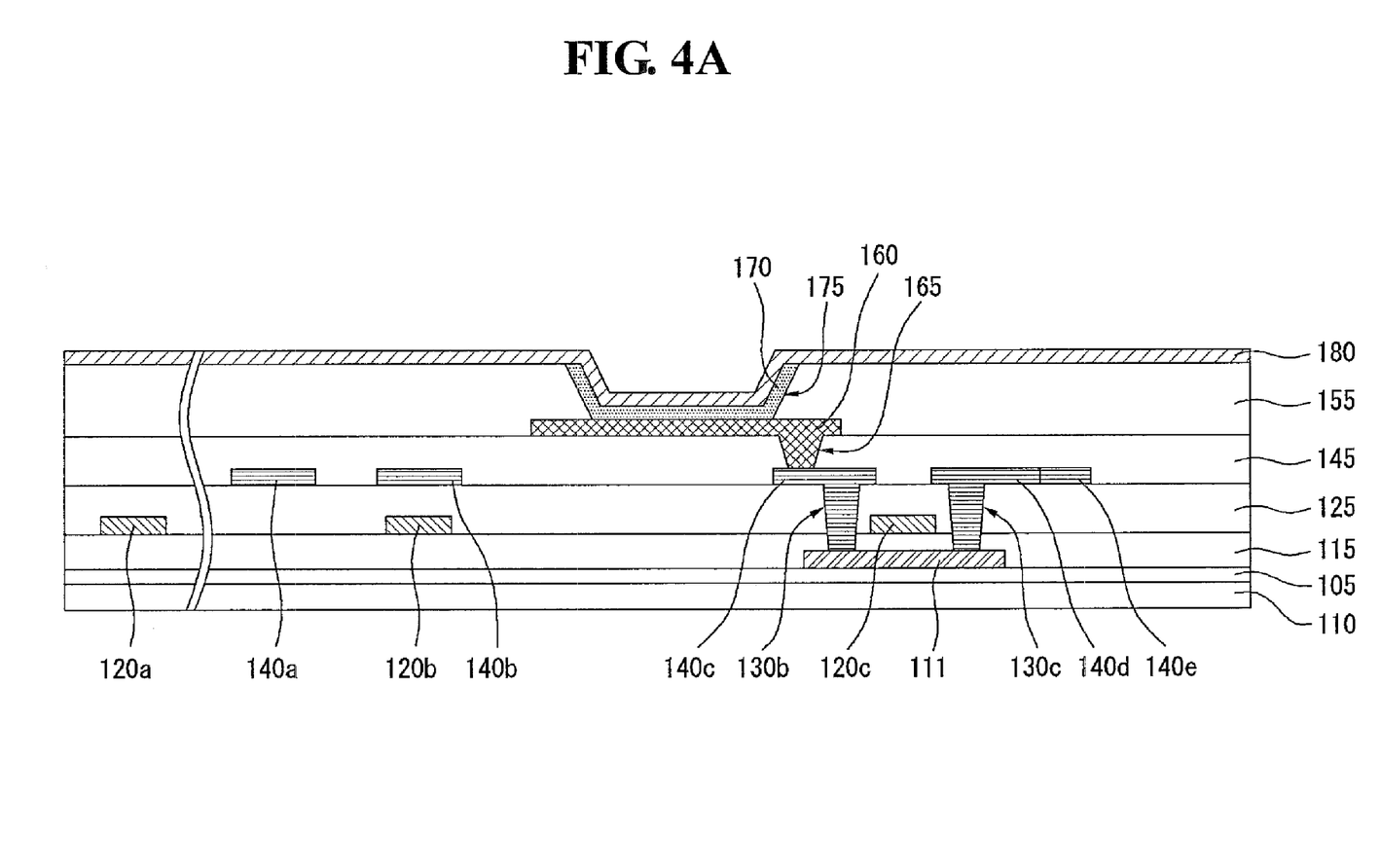
FIGS. 4A and 4B are cross-sectional views of a subpixel in an area Z1 of FIG. 3.
Figure 4B:
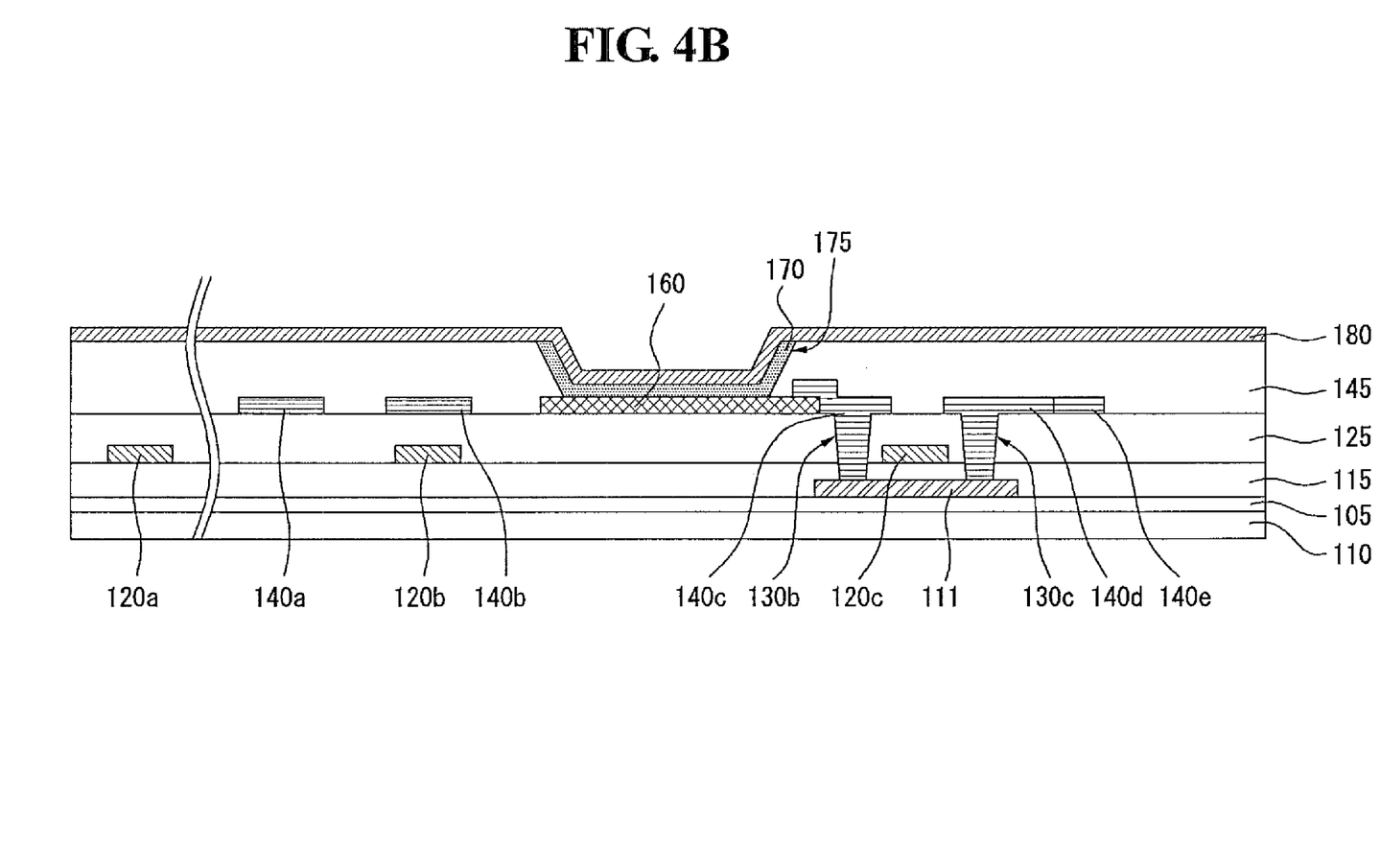

FIGS. 4A and 4B are cross-sectional views of a subpixel in an area Z1 of FIG. 3.

As shown in FIG. 4A, a buffer layer 105 is positioned on the first substrate 110. The buffer layer 105 prevents impurities (e.g., alkali ions discharged from the first substrate 110) from being introduced during formation of the thin film transistor in a succeeding process. The buffer layer 105 may be selectively formed using silicon oxide (SiO2), silicon nitride (SiNX), or using other materials. The first substrate 110 may be formed of glass, plastic or metal.

A semiconductor layer 111 is positioned on the buffer layer 105. The semiconductor layer 111 may include amorphous silicon or crystallized polycrystalline silicon. The semiconductor layer 111 may include a source region and a drain region including p-type or n-type impurities. The semiconductor layer 111 may include a channel region in addition to the source region and the drain region.

A first insulating layer 115, which may be a gate insulating layer, is positioned on the semiconductor layer 111. The first insulating layer 115 may include a silicon oxide ($SiO_x$) layer, a silicon nitride ($SiN_x$) layer, or a multi-layered structure or a combination thereof.

A gate electrode 120c is positioned on the first insulating layer 115 in a given area of the semiconductor layer 111, e.g., at a location corresponding to the channel region of the semiconductor layer 111 when impurities are doped. The scan line 120a and the capacitor lower electrode 120b may be positioned on the same formation layer as the gate electrode 120c.

The gate electrode 120c may be formed of any one selected from the group consisting of molybdenum (Mo), aluminum (Al), chromium (Cr), gold (Au), titanium (Ti), nickel (Ni), neodymium (Nd) and copper (Cu), or a combination thereof. The gate electrode 120c may have a multi-layered structure formed of Mo, Al, Cr, Au, Ti, Ni, Nd, or Cu, or a combination thereof. The gate electrode 120c may have a double-layered structure including Mo/Al—Nd or Mo/Al.

The scan line 120a may be formed of any one selected from the group consisting of Mo, Al, Cr, Au, Ti, Ni, Nd, or Cu, or a combination thereof. The scan line 120a may have a multi-layered structure formed of Mo, Al, Cr, Au, Ti, Ni, Nd, or Cu, or a combination thereof. The scan line 120a may have a double-layered structure including Mo/Al—Nd or Mo/Al.

A second insulating layer 125, which may be an interlayer dielectric, is positioned on the first substrate 110 on which the scan line 120a, the capacitor lower electrode 120b and the gate electrode 120c are positioned. The second insulating layer 125 may include a silicon oxide ($SiO_x$) layer, a silicon nitride ($SiN_x$) layer, or a multi-layered structure or a combination thereof.

Contact holes 130b and 130c are positioned inside the second insulating layer 125 and the first insulating layer 115 to expose a portion of the semiconductor layer 111.

A drain electrode 140c and a source electrode 140d are positioned in the subpixel area to be electrically connected to the semiconductor layer 111 through the contact holes 130b and 130c passing through the second insulating layer 125 and the first insulating layer 115.

The drain electrode 140c and the source electrode 140d may have a single-layered structure or a multi-layered structure. When the drain electrode 140c and the source electrode 140d have the single-layered structure, the drain electrode 140c and the source electrode 140d may be formed of Mo, Al, Cr, Au, Ti, Ni, Nd, or Cu, or a combination thereof. When the drain electrode 140c and the source electrode 140d have the multi-layered structure, the drain electrode 140c and the source electrode 140d may have a double-layered structure including Mo/Al—Nd or a triple-layered structure including Mo/Al/Mo or Mo/Al—Nd/Mo.

The data line 140a, the capacitor upper electrode 140b, and the power supply line 140e may be positioned on the same formation layer as the drain electrode 140c and the source electrode 140d.

The data line 140a and the power supply line 140e positioned in the non-subpixel area may have a single-layered structure or a multi-layered structure. When the data line 140a and the power supply line 140e have the single-layered structure, the data line 140a and the power supply line 140e may be formed of Mo, Al, Cr, Au, Ti, Ni, Nd, or Cu, or a combination thereof.

When the data line 140a and the power supply line 140e have the multi-layered structure, the data line 140a and the power supply line 140e may have a double-layered structure including Mo/Al—Nd or a triple-layered structure including Mo/Al/Mo or Mo/Al—Nd/Mo. The data line 140a and the power supply line 140e may have a triple-layered structure including Mo/Al—Nd/Mo.

A third insulating layer 145 is positioned on the data line 140a, the capacitor upper electrode 104b, the drain electrode 140c, the source electrode 140d, and the power supply line 140e. The third insulating layer 145 may be a planarization layer for obviating the height difference of a lower structure. The third insulating layer 145 may be formed using a method such as spin on glass (SOG) obtained by coating an organic material such as polyimide, benzocyclobutene-based resin and acrylate in the liquid form and then hardening it. Further, an inorganic material such a silicone oxide may be used. Otherwise, the third insulating layer 145 may be a passivation layer, and may include a silicon oxide ($SiO_x$) layer, a silicon nitride ($SiN_x$) layer, or a multi-layered structure including a combination thereof.

A via hole 165 is positioned inside the third insulating layer 145 to expose any one of the drain and source electrodes 140c and 140d. A first electrode 160 is positioned on the third insulating layer 145 to be electrically connected to any one of the drain and source electrodes 140c and 140d via the via hole 165.

The first electrode 160 may be an anode electrode. In case that the organic light emitting device has a bottom emission or dual emission structure, the first electrode 160 may be formed of a transparent material such as indium-tin-oxide (ITO), indium-zinc-oxide (IZO), or zinc oxide (ZnO). In case that the organic light emitting device has a top emission structure, the first electrode 160 may include a layer formed of one of ITO, IZO or ZnO, and a reflective layer formed of one of Al, Ag or Ni under the layer. Further, the first electrode 160 may have a multi-layered structure in which the reflective layer is positioned between two layers formed of one of ITO, IZO or ZnO.

A fourth insulating layer 155 including an opening 175 is positioned on the first electrode 160. The opening 175 provides electrical insulation between the neighboring first electrodes 160 and exposes a portion of the first electrode 160. A light emitting layer 170 is positioned on the first electrode 160 exposed by the opening 175.

A second electrode 180 is positioned on the light emitting layer 170. The second electrode 180 may be a cathode electrode, and may be formed of Mg, Ca, Al and Ag having a low work function or a combination thereof. In case that the organic light emitting device has a top emission or dual emission structure, the second electrode 180 may be thin enough to transmit light. In case that the organic light emitting device has a bottom emission structure, the second electrode 180 may be thick enough to reflect light.

The organic light emitting device according to the exemplary embodiment using a total of 7 masks was described as an example. The 7 masks may be used in a process for forming each of the semiconductor layer, the gate electrode (including the scan line and the capacitor lower electrode), the contact holes, the drain and source electrodes (including the data line, the power supply line and the capacitor upper electrode), the via holes, the first electrode, and the opening.

An example of how an organic light emitting device is formed using a total of 5 masks will now be given.

As shown in FIG. 4B, the buffer layer 105 is positioned on the first substrate 100, and the semiconductor layer 111 is positioned on the buffer layer 105. The first insulating layer 115 is positioned on the semiconductor layer 111. The gate electrode 120c, the capacitor lower electrode 120b, and the scan line 120a are positioned on the first insulating layer 115. The second insulating layer 125 is positioned on the gate electrode 120c.

The first electrode 160 is positioned on the second insulating layer 125, and the contact holes 130b and 130c are positioned to expose the semiconductor layer 111. The first electrode 160 and the contact holes 130b and 130c may be simultaneously formed.

The source electrode 140d, the drain electrode 140c, the data line 140a, the capacitor upper electrode 140b, and the power supply line 140e are positioned on the second insulating layer 125. A portion of the drain electrode 140c may be positioned on the first electrode 160.

A pixel or subpixel definition layer or the third insulating layer 145, which may be a bank layer, is positioned on the first substrate 110 on which the above-described structure is formed. The opening 175 is positioned on the third insulating layer 145 to expose the first electrode 160. The light emitting layer 170 is positioned on the first electrode 160 exposed by the opening 175, and the second electrode 180 is positioned on the light emitting layer 170.

The aforementioned organic light emitting device can be manufactured using a total of 5 masks. The 5 masks are used in a process for forming each of the semiconductor layer, the gate electrode (including the scan line and the capacitor lower electrode), the first electrode (including the contact holes), the drain and source electrodes (including the data line, the power supply line and the capacitor upper electrode), and the opening. Accordingly, the organic light emitting device according to the exemplary embodiment can reduce the manufacturing cost by a reduction in the number of masks and can improve the efficiency of mass production.

Referring again to FIG. 3, a second substrate 185 is positioned to face the first substrate 110. A seal member 190 between the first substrate 110 and the second substrate 185 attaches the first substrate 110 to the second substrate 185. The seal member 190 may substantially have a water vapor permeation rate of $10^0$ g/m$^2$ day to $10^3$ g/m$^2$ day.

The seal member 190 includes a pressure sensitive adhesive (PSA). The pressure sensitive adhesive may substantially have a water vapor permeation rate of $10^0$ g/m$^2$ day to $10^3$ g/m$^2$ day.

The seal member 190 may have a width of 1 mm to 5 mm so as to increase sealing properties.

The seal member 190 may be coated on the entire surface of the display unit.

At least one of the first substrate 110 or the second substrate 185 is formed of a flexible material, and thus can have flexibility after sealing the organic light emitting device. In case that the second substrate 185 is a metal or a film, a thickness of the first substrate 110 may be equal to or larger than a thickness of the second substrate 185.

At least two projections 195 are positioned in an edge area of the second substrate 185. The edge area of the second substrate 185 may correspond to a bezel area BZ of the first substrate 110.

It is advantageous that the projection 195 has a pointed shape in a projecting direction, and an end thereof is not sharp. In case that signal lines are positioned on the bezel area BZ of the first substrate 110, the shape of the projection 195 is made so as to prevent a damage of the signal lines caused by a contact of the signal lines and the projection 195.

A width of the projection 195 may be equal to or smaller than a width of the bezel area BZ of the first substrate 110. In this case, the bezel area BZ corresponds to an outside area of the display unit 112 on the first substrate 110.

Figure 5:
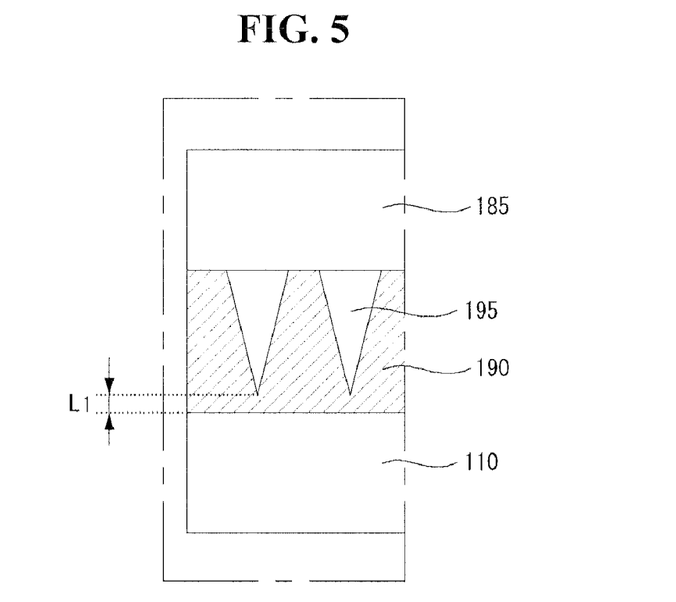
FIG. 5 is an enlarged view of a projection in an area Z2 of FIG. 3.

FIG. 5 is an enlarged view of a projection in an area Z2 of FIG. 3.

As shown in FIG. 5, an end of the projection 195 may contact an inner surface of the first substrate 110. However, the end of the projection 195 may be spaced apart from the inner surface of the first substrate 110 with a predetermined distance by a structure (for example, signal lines) on the first substrate 110, a viscosity of the seal member 190 or a pressure or a temperature applied during a attaching process of the first substrate 110 and the second substrate 185.

The projection 195 may be spaced apart from the first substrate 110 with at least distance L1 that is larger than 0 nm and equal to or less than 10 μm. Since the distance L1 between the projection 195 and the first substrate 110 is proportional to an effect capable of blocking the permeation of moisture, and the like, the distance L1 has a minimum value.

As described above, the projection 195 positioned in the edge area of the second substrate 185 has a structural advantages capable of maximizing an effect for cutting off a permeation path of moisture or oxygen after the first substrate 110 is attached to the second substrate 185 using the seal member 190.

The projection 195 may be formed using a different formation process depending on a material of the second substrate 185. In case that a material of the second substrate 185 is a metal, the projection 195 may be formed using a press process. In case that a material of the second substrate 185 is glass, the projection 195 may be formed using an etching process. The projection 195 may have a various shape such as a cone, a spiral, a triangle, a quadrilateral.

Although the projection 195 is formed in the second substrate 185 in the first exemplary embodiment, the present invention is not limited thereto. The projection 195 may be formed in the first substrate 110.

Figure 6A:
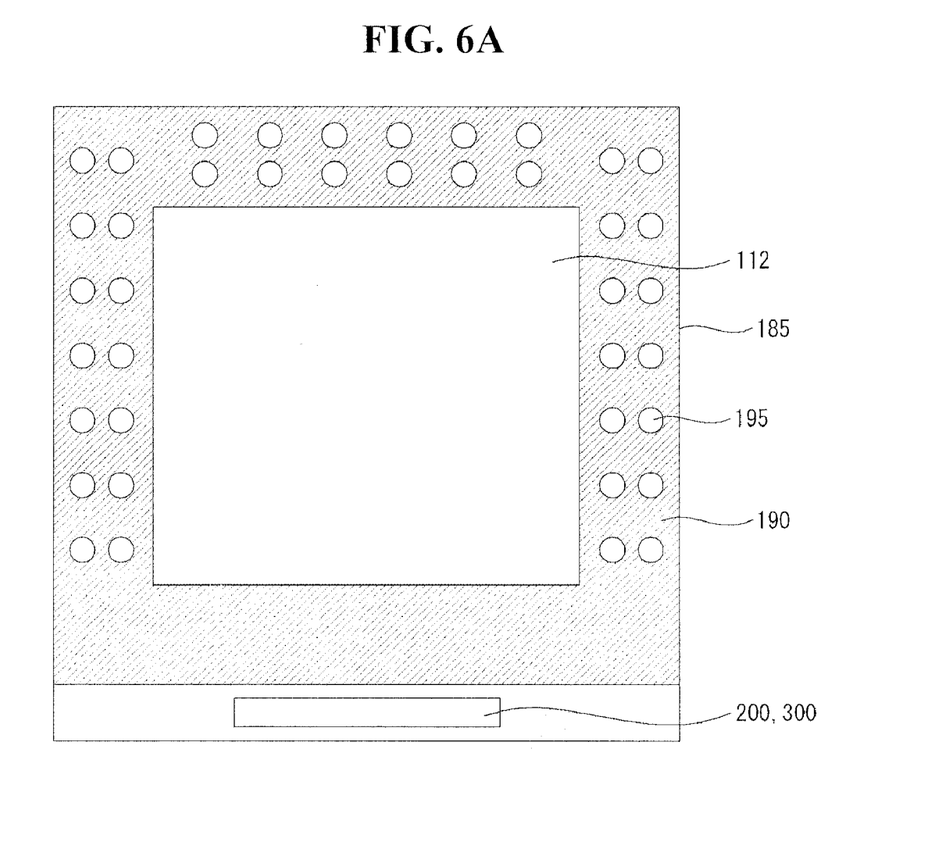
FIGS. 6A to 6C are a perspective view showing the projection of FIG. 3 and a substrate.
Figure 6B:
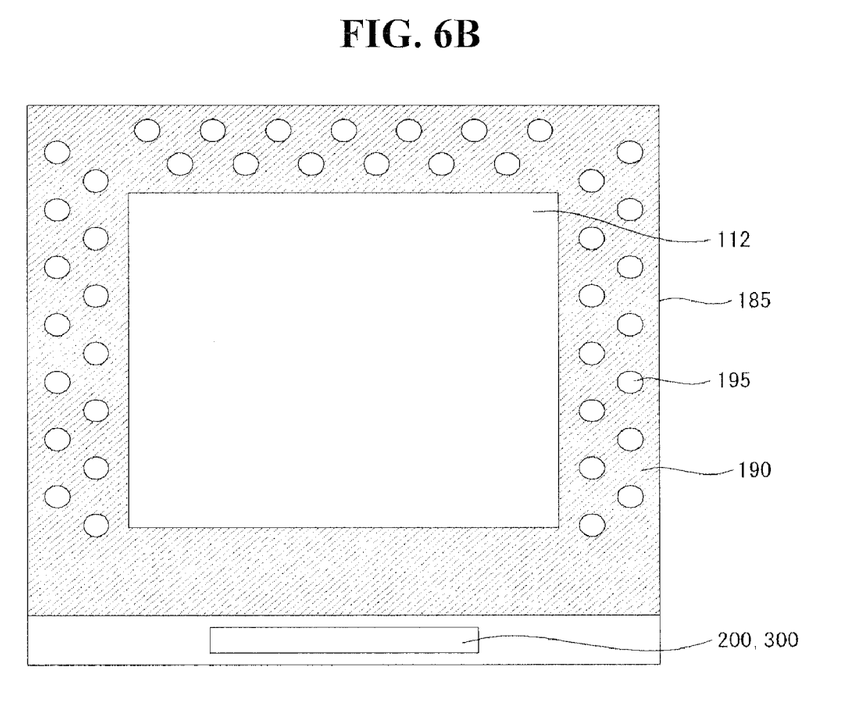
Figure 6C:
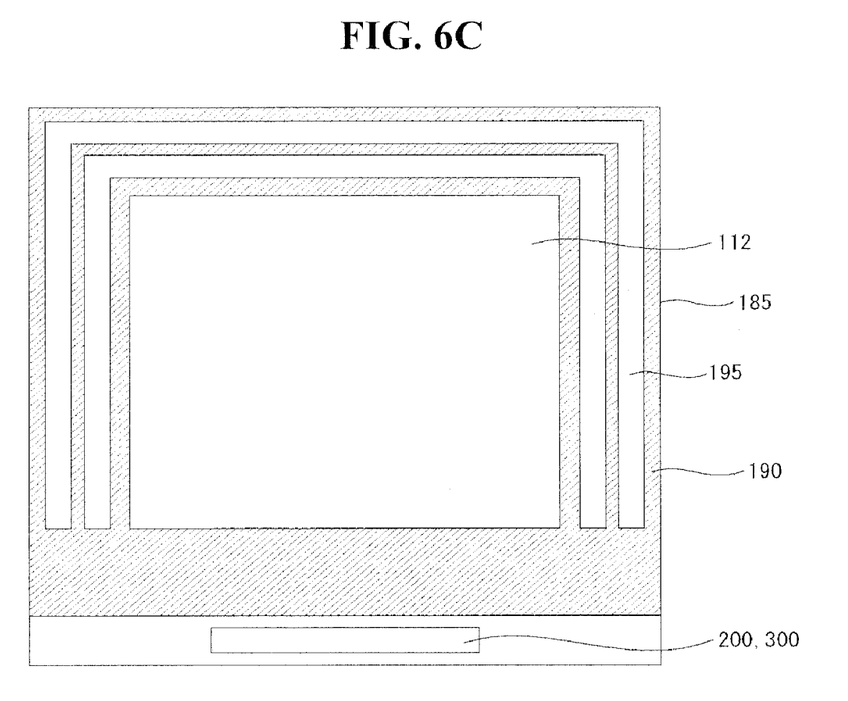

FIGS. 6A to 6C are a perspective view showing the projection of FIG. 3 and a substrate.

As shown in FIG. 6A, the projections 195 may be uniformly formed in the edge area of the second substrate 185 in pairs. The structure of the projections 195 can provide the convenience in their formation process.

As shown in FIG. 6B, the projections 195 may be formed in the edge area of the second substrate 185 in a zigzag form. The structure of the projections 195 in FIG. 6B may be more advantageous than the structure of the projections 195 in FIG. 6A in cutting off a permeation path of moisture or oxygen.

As shown in FIG. 6C, the projections 195 may be formed in the edge area of the second substrate 185 in one united form. The structure of the projections 195 in FIG. 6C may provide the convenience in their formation process and can efficiently cut off a permeation path of moisture or oxygen.

As shown in FIGS. 6A to 6C, the projections 195 may not be formed under the substrate, on which the drivers 200 and 300 are positioned, in consideration of a damage of the signal lines used to connect the drivers 200 and 300 to the display unit 112. However, if the damage problem of the signal lines is solved, the projections 195 may be formed to surround the outside area of the display unit 112.

Figure 7A:
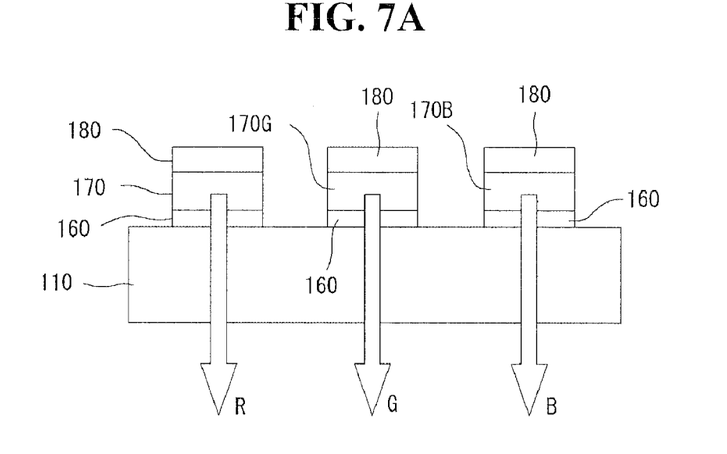
FIGS. 7A to 7C illustrate various implementations of a color image display method in the organic light emitting device.
Figure 7B:
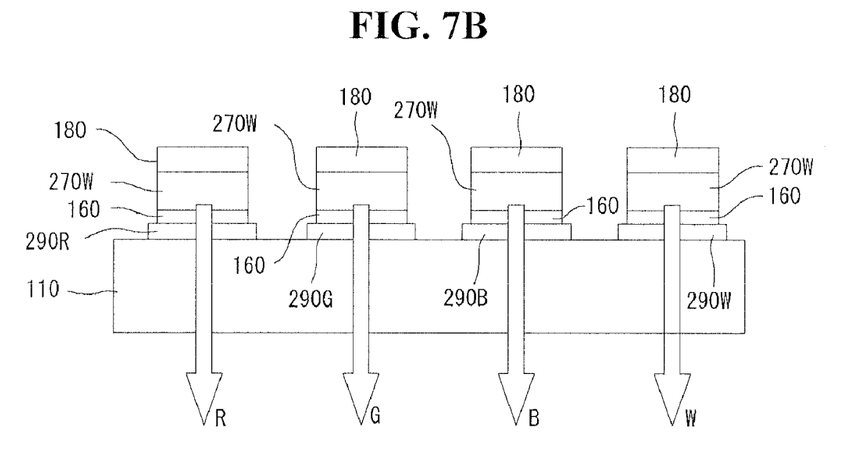
Figure 7C:
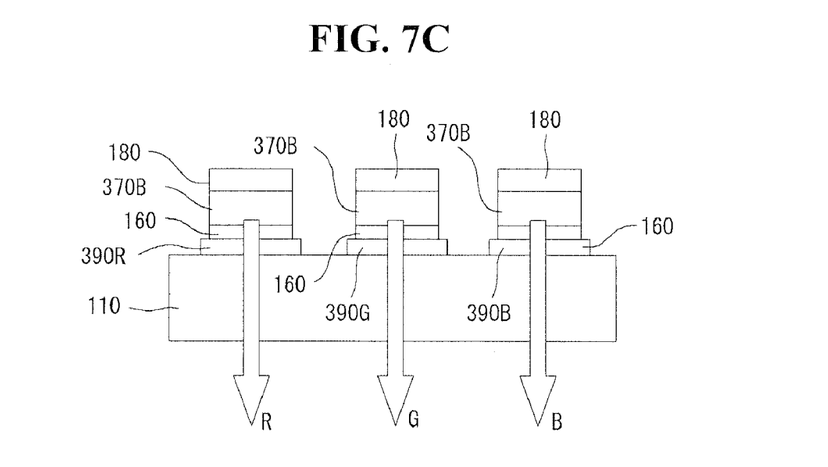

FIGS. 7A to 7C illustrate various implementations of a color image display method in the organic light emitting device.

FIG. 7A illustrates a color image display method in an organic light emitting device that separately includes a red light emitting layer 170R to emit red light, a green light emitting layer 170G to emit green light, and a blue light emitting layer 170B to emit blue light. The red, green and blue light produced by the red, green and blue light emitting layers 170R, 170G and 170B is mixed to display a color image.

In FIG. 7A, the red, green and blue light emitting layers 170R, 170G and 170B may each include an electron transport layer, a hole transport layer, and the like. It is possible to variously change an arrangement and a structure between additional layers such as the electron transport layer and the hole transport layer and each of the red, green and blue light emitting layers 170R, 170G and 170B.

FIG. 7B illustrates a color image display method in an organic light emitting device including a white light emitting layer 270W, a red color filter 290R, a green color filter 290G, a blue color filter 290B, and a white color filter 290W.

As shown in FIG. 7B, the red color filter 290R, the green color filter 290G, the blue color filter 290B, and the white color filter 290W each transmit white light produced by the white light emitting layer 270W and produce red light, green light, blue light, and white light. The red, green, blue, and white light is mixed to display a color image. The white color filter 290W may be removed depending on color sensitivity of the white light produced by the white light emitting layer 270W and combination of the white light and the red, green and blue light.

While FIG. 7B has illustrated the color display method of four subpixels using combination of the red, green, blue, and white light, a color display method of three subpixels using combination of the red, green, and blue light may be used.

In FIG. 7B, the white light emitting layer 270W may include an electron transport layer, a hole transport layer, and the like. It is possible to variously change an arrangement and a structure between additional layers such as the electron transport layer and the hole transport layer and the white light emitting layer 270W.

FIG. 7C illustrates a color image display method in an organic light emitting device including a blue light emitting layer 370B, a red color change medium 390R, a green color change medium 390G, and a blue color change medium 390B.

As shown in FIG. 7C, the red color change medium 390R, the green color change medium 390G, and the blue color change medium 390B each transmit blue light produced by the blue light emitting layer 370B to produce red light, green light and blue light. The red, green and blue light is mixed to display a color image.

The blue color change medium 390B may be removed depending on color sensitivity of the blue light produced by the blue light emitting layer 370B and combination of the blue light and the red and green light.

In FIG. 7C, the blue light emitting layer 370B may include an electron transport layer, a hole transport layer, and the like. It is possible to variously change an arrangement and a structure between additional layers such as the electron transport layer and the hole transport layer and the blue light emitting layer 370B.

While FIGS. 7A to 7C have illustrated and described the organic light emitting device having a bottom emission structure, the exemplary embodiment is not limited thereto. The display device according to the exemplary embodiment may have a top emission structure, and thus can a different arrangement and a different structure depending on the top emission structure.

While FIGS. 7A to 7C have illustrated and described three kinds of color image display method, the exemplary embodiment is not limited thereto. The exemplary embodiment may use various kinds of color image display method whenever necessary.

Figure 8:
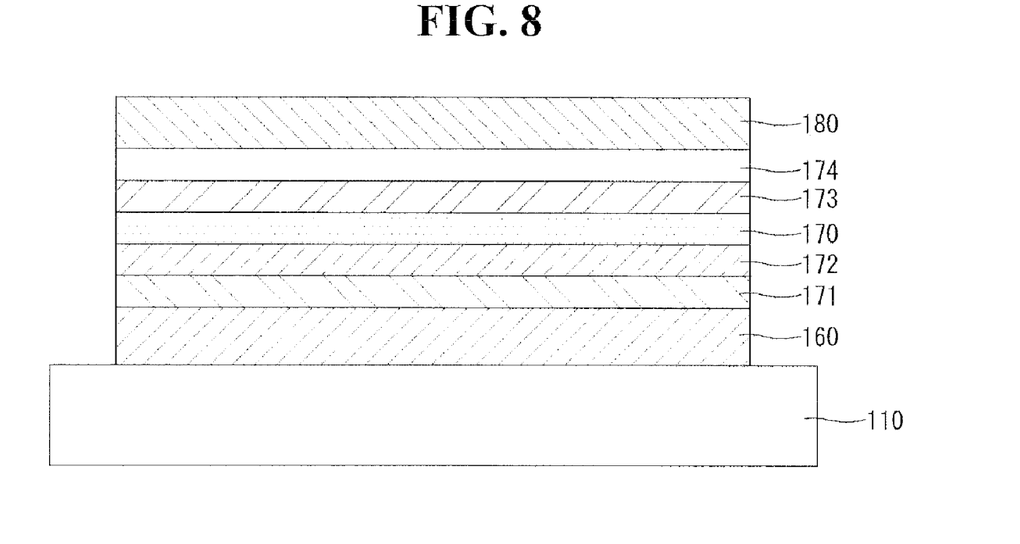
FIG. 8 is a cross-sectional view of the organic light emitting device.

FIG. 8 is a cross-sectional view of the organic light emitting device.

As shown in FIG. 8, the organic light emitting device according to the exemplary embodiment includes the substrate 110, the first electrode 160 on the substrate 110, a hole injection layer 171 on the first electrode 160, a hole transport layer 172, a light emitting layer 170, an electron transport layer 173, an electron injection layer 174, and the second electrode 180 on the electron injection layer 174.

The hole injection layer 171 may function to facilitate the injection of holes from the first electrode 160 to the light emitting layer 170. The hole injection layer 171 may be formed of at least one selected from the group consisting of copper phthalocyanine (CuPc), PEDOT(poly(3,4)-ethylenedioxythiophene), polyaniline (PANI) and NPD(N,N-dinaphthyl-N,N'-diphenyl benzidine), but is not limited thereto. The hole injection layer 171 may be formed using an evaporation method or a spin coating method.

The hole transport layer 172 functions to smoothly transport holes. The hole transport layer 172 may be formed from at least one selected from the group consisting of NPD(N,N-dinaphthyl-N,N'-diphenyl benzidine), TPN(N,N'-bis-(3-methylphenyl)-N,N'-bis-(phenyl)-benzidine, s-TAD and MTDATA(4,4',4"-Tris(N-3-methylphenyl-N-phenyl-amino)-triphenylamine), but is not limited thereto. The hole transport layer 172 may be formed using an evaporation method or a spin coating method.

The light emitting layer 170 may be formed of a material capable of producing red, green, blue and white light, for example, a phosphorescence material or a fluorescence material.

In case that the light emitting layer 170 produces red light, the light emitting layer 170 includes a host material including carbazole biphenyl (CBP) or N,N-dicarbazolyl-3,5-benzene (mCP). Further, the light emitting layer 170 may be formed of a phosphorescence material including a dopant material including any one selected from the group consisting of PIQIr (acac)(bis(1-phenylisoquinoline)acetylacetonate iridium), PQIr(acac)(bis(1-phenylquinoline)acetylacetonate iridium), PQIr(tris(1-phenylquinoline)iridium) and PtOEP(octaethylporphyrin platinum) or a fluorescence material including PBD:Eu(DBM)3(Phen) or Perylene, but is not limited thereto.

In case that the light emitting layer 170 produces green light, the light emitting layer 170 includes a host material including CBP or mCP. Further, the light emitting layer 170 may be formed of a phosphorescence material including a dopant material including Ir(ppy)3(fac tris(2-phenylpyridine)iridium) or a fluorescence material including Alq3(tris (8-hydroxyquinolino)aluminum), but is not limited thereto.

In case that the light emitting layer 170 produces blue light, the light emitting layer 170 includes a host material including CBP or mCP. Further, the light emitting layer 170 may be formed of a phosphorescence material including a dopant material including (4,6-F2 ppy)2Irpic or a fluorescence material including any one selected from the group consisting of spiro-DPVBi, spiro-6P, distyryl-benzene (DSB), distyryl-arylene (DSA), PFO-based polymers, PPV-based polymers and a combination thereof, but is not limited thereto.

The electron transport layer 173 functions to facilitate the transportation of electrons. The electron transport layer 173 may be formed of at least one selected from the group consisting of Alq3(tris(8-hydroxyquinolino)aluminum, PBD, TAZ, spiro-PBD, BAlq, and SAlq, but is not limited thereto. The electron transport layer 173 may be formed using an evaporation method or a spin coating method.

The electron transport layer 173 can also function to prevent holes, which are injected from the first electrode 160 and then pass through the light emitting layer 170, from moving to the second electrode 180. In other words, the electron transport layer 173 serves as a hole stop layer, which facilitates the coupling of holes and electrons in the light emitting layer 170.

The electron injection layer 174 functions to facilitate the injection of electrons. The electron injection layer 174 may be formed of Alq3(tris(8-hydroxyquinolino)aluminum), PBD, TAZ, spiro-PBD, BAlq or SAlq, but is not limited thereto. The electron injection layer 174 may be formed of an organic material and an inorganic material forming the electron injection layer 174 through a vacuum evaporation method.

The hole injection layer 171 or the electron injection layer 174 may further include an inorganic material. The inorganic material may further include a metal compound. The metal compound may include alkali metal or alkaline earth metal. The metal compound including the alkali metal or the alkaline earth metal may include at least one selected from the group consisting of LiQ, LiF, NaF, KF, RbF, CsF, FrF, $BeF_2$, $MgF_2$, $CaF_2$, $SrF_2$, $BaF_2$, and $RaF_2$, but is not limited thereto.

Thus, the inorganic material inside the electron injection layer 174 facilitates hopping of electrons injected from the second electrode 180 to the light emitting layer 170, so that holes and electrons injected into the light emitting layer 170 are balanced. Accordingly, the light emission efficiency can be improved.

Further, the inorganic material inside the hole injection layer 171 reduces the mobility of holes injected from the first electrode 160 to the light emitting layer 170, so that holes and electrons injected into the light emitting layer 170 are balanced. Accordingly, the light emission efficiency can be improved.

At least one of the electron injection layer 174, the electron transport layer 173, the hole transport layer 172, the hole injection layer 171 may be omitted.

Figure 9:
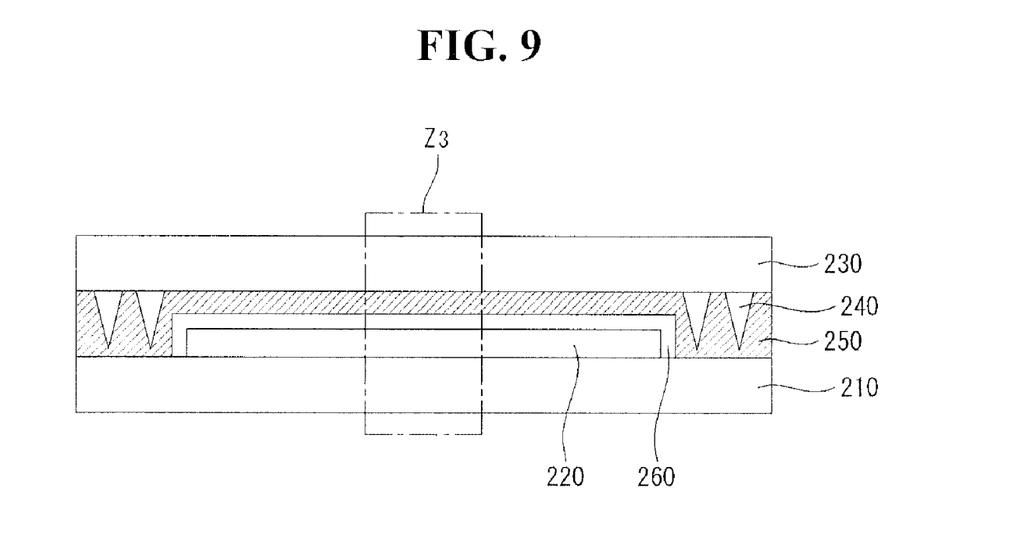
FIG. 9 is a cross-sectional view of an organic light emitting device according to a second exemplary embodiment.

FIG. 9 is a cross-sectional view of an organic light emitting device according to a second exemplary embodiment.

As shown in FIG. 9, the organic light emitting device according to the second exemplary embodiment includes a first substrate 210, and a display unit 220 including a plurality of pixels arranged in a matrix format on the first substrate 210. A second substrate 230 is positioned to face the first substrate 210. A seal member 250 between the first substrate 210 and the second substrate 230 attaches the first substrate 210 to the second substrate 230. The seal member 250 may substantially have a water vapor permeation rate of $10^0$ $g/m^2$ day to $10^3$ $g/m^2$ day.

The seal member 250 includes a pressure sensitive adhesive (PSA). The pressure sensitive adhesive may substantially have a water vapor permeation rate of $10^0$ $g/m^2$ day to $10^3$ $g/m^2$ day.

The seal member 250 may substantially have a width of 1 mm to 5 mm so as to increase sealing properties.

At least two projections 240 are positioned in an edge area of the second substrate 230. The edge area of the second substrate 230 may correspond to a bezel area BZ of the first substrate 210.

While the second exemplary embodiment have a similar structure to the first exemplary embodiment, one or all of a passivation layer and a buffer layer may be positioned on the display unit 220 in the second exemplary embodiment.

Figure 10:
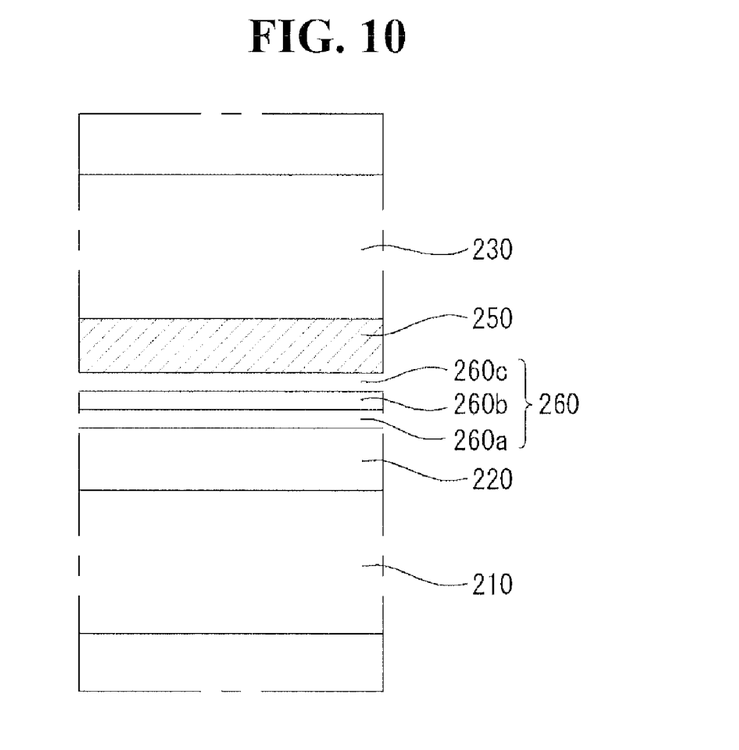
FIG. 10 is an enlarged view of an area Z3 of FIG. 9.

FIG. 10 is an enlarged view of an area Z3 of FIG. 9.

As shown in FIG. 10, a protective layer 260 such as a passivation layer and a buffer layer is positioned on the display unit 220, the seal member 250 is positioned on the protective layer 260, and the second substrate 230 is positioned on the seal member 250.

The protective layer 260 may have a single-layered structure including one of an inorganic film, an organic film, and a polymer film. The protective layer 260 may have a multi-layered structure including an inorganic film 260a, an organic film 260b, and an inorganic film 260c, or may have a single-layered structure including a combination thereof.

In case that the protective layer 260 is a passivation layer, the protective layer 260 may have a water vapor permeation rate more than 0 and equal to or less than of $10^{-2}$ $g/m^2$ day and a thickness of 50 μm to 100 μm. In case that the protective layer 260 is a passivation layer having a multi-layered structure, the protective layer 260 may have a water vapor permeation rate more than 0 and equal to or less than of $10^{-6}$ $g/m^2$ day.

In case that the protective layer 260 include an organic material, examples of the organic material include acrylic resin, polycarbonates resin, polyimide resin, polyimide fluoride resin, benzo-guanamine resin, melamine resin, annular polyolefin resin, novolac resin, polycinnamate vinyl, cyclised rubber, polyvinyl chloride resin, polystyrene resin, phenolic resin, alkyd resin, epoxy resin, polyurethane resin, polyester resin, maleate resin, polyamide resin.

In case that the protective layer 260 include an inorganic material, examples of the inorganic material include silicon oxide ($SiO_2$ or $SiO_X$), aluminum oxide ($Al_2O_3$ or $AlO_X$), titanium oxide ($TiO_2$), yttrium oxide ($Y_2O_3$ or $YO_X$), germanium oxide ($GeO_2$ or $GeO_X$), zinc oxide (ZnO), magnesium oxide (MgO or $MgO_X$), calcium oxide (CaO), boron oxide ($B_2O_3$), strontium oxide (SrO), barium oxide (BaO), lead oxide (PbO), zirconium oxide ($ZrO_2$), sodium oxide ($Na_2O$), lithium oxide ($Li_2O$), kalium oxide ($K_2O$), silicon nitride ($Si_3N_4$), silicon nitride oxide ($SiO_XNY$), calcium fluoride ($CaF_2$).

In particular, the protective layer 260 needs a heat resistant material, it is advantageous that the protective layer 260 include acrylic resin, polyimide resin, polyimide fluoride resin, annular polyolefin resin, or the inorganic material.

Figure 11:
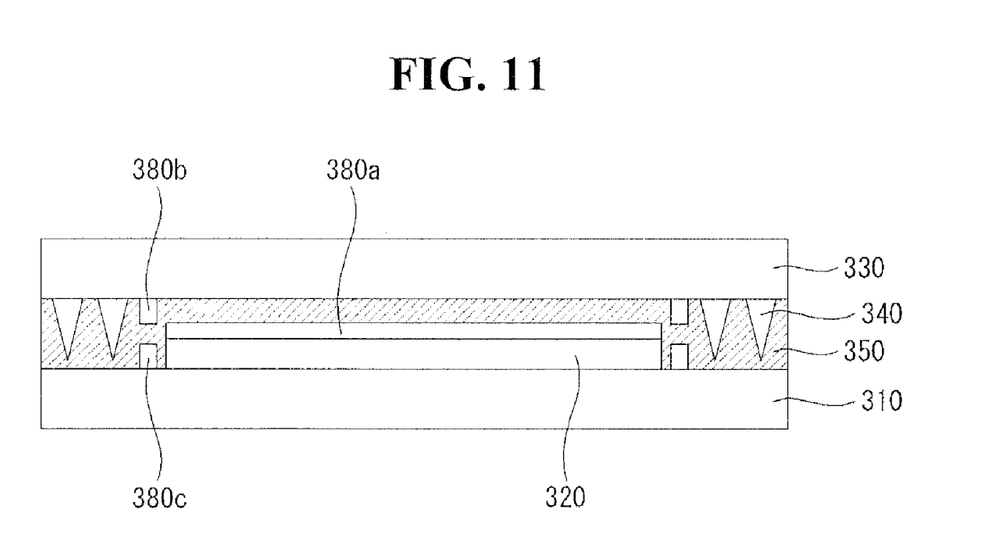
FIG. 11 is a cross-sectional view of an organic light emitting device according to a third exemplary embodiment.

FIG. 11 is a cross-sectional view of an organic light emitting device according to a third exemplary embodiment.

As shown in FIG. 11, the organic light emitting device according to the third exemplary embodiment includes a first substrate 310, and a display unit 320 including a plurality of pixels arranged in a matrix format on the first substrate 310. A second substrate 330 is positioned to face the first substrate 310. A seal member 350 between the first substrate 310 and the second substrate 330 attaches the first substrate 310 to the second substrate 330. The seal member 350 may substantially have a water vapor permeation rate of $10^0$ $g/m^2$ day to $10^3$ $g/m^2$ day.

The seal member 350 includes a pressure sensitive adhesive (PSA). The pressure sensitive adhesive may substantially have a water vapor permeation rate of $10^0$ $g/m^2$ day to $10^3$ $g/M^2$ day.

The seal member 350 may substantially have a width of 1 mm to 5 mm so as to increase sealing properties.

At least two projections 340 are positioned in an edge area of the second substrate 330.

The organic light emitting device according to the third exemplary embodiment may include moisture absorbents 380a, 380b, and 380c on the display unit 320, on an internal surface of the first substrate 310, or on an internal surface of the second substrate 330.

In case that the organic light emitting device according to the third exemplary embodiment includes the moisture absorbents 380a on the display unit 320, the moisture absorbents 380a is not positioned on the entire surface of the display unit 320. In other words, the moisture absorbents 380a may be formed in the net form so as to be positioned at a location corresponding to a non-emitting area of the subpixel or may be positioned in some of the non-emitting areas.

If an image is displayed on the display unit 320 in a direction of the first substrate 301, the moisture absorbents 380a may be positioned on the entire surface of the display unit 320.

Figure 12:
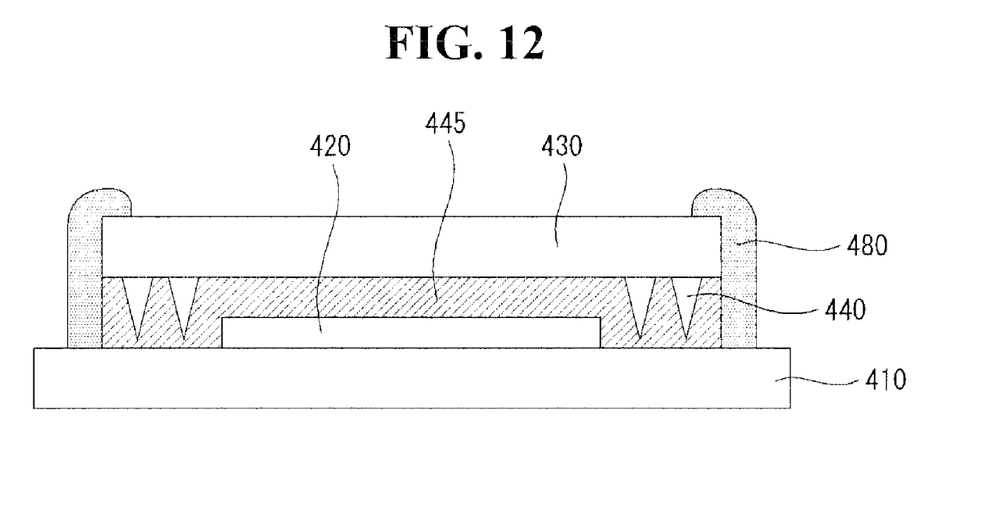
FIG. 12 is a cross-sectional view of an organic light emitting device according to a fourth exemplary embodiment.

FIG. 12 is a cross-sectional view of an organic light emitting device according to a fourth exemplary embodiment.

As shown in FIG. 12, the organic light emitting device according to the fourth exemplary embodiment includes a first substrate 410, and a display unit 420 including a plurality of pixels arranged in a matrix format on the first substrate 410. A second substrate 430 is positioned to face the first substrate 410. A seal member 445 between the first substrate 410 and the second substrate 430 attaches the first substrate 410 to the second substrate 430. The seal member 445 may substantially have a water vapor permeation rate of $10^0$ g/m$^2$ day to $10^3$ g/m$^2$ day.

The seal member 445 includes a pressure sensitive adhesive (PSA). The pressure sensitive adhesive may substantially have a water vapor permeation rate of $10^0$ g/m$^2$ day to $10^3$ g/M$^2$ day.

The seal member 445 may substantially have a width of 1 mm to 5 mm so as to increase sealing properties.

At least two projections 440 are positioned in an edge area of the second substrate 430.

The size of the first substrate 410 may be smaller than the size of the second substrate 430, or the size of the second substrate 430 may be smaller than the size of the first substrate 410. An adhesive 480 is positioned in a space provided by the first and second substrates 410 and 430 each having the different size. Although the fourth exemplary embodiment has described the case that the size of the second substrate 430 is smaller than the size of the first substrate 410, it is not limited thereto.

It is advantageous that the adhesive 480 is formed to be thick around a contact surface of the first substrate 410 and the second substrate 430 so as to prevent moisture or oxygen from being permeated from the outside.

As described above, the organic light emitting device according to the exemplary embodiments can increase life span and improve the reliability.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art.

What is claimed is:

1. An organic light emitting device comprising:
   a first substrate;
   a display unit on the first substrate, the display unit including a plurality of subpixels;
   a second substrate positioned to face the first substrate;
   a seal member that attaches the first substrate to the second substrate, the seal member substantially having a water vapor permeation rate of $10^0$ g/m$^2$ day to $10^3$ g/m$^2$ day; and
   at least one projection positioned at a location corresponding to a bezel area of at least one of the first substrate and the second substrate.

2. The organic light emitting device of claim 1, wherein the projection contacts at least one of the first substrate and the second substrate.

3. The organic light emitting device of claim 1, wherein a distance between the projection and at least one of the first substrate and the second substrate is more than 0 mm and equal to or less than 10 μm.

4. The organic light emitting device of claim 1, wherein a width of the projection is smaller than a width of the bezel area.

5. The organic light emitting device of claim 1, further comprising a passivation layer on the display unit, the passivation layer having a water vapor permeation rate that is more than 0 and equal to or less than $10^{-2}$ g/m$^2$ day.

6. The organic light emitting device of claim 5, wherein the passivation layer is one of an inorganic film, an organic film, and a polymer film.

7. The organic light emitting device of claim 5, wherein the passivation layer has a single-layered structure or a multi-layered structure.

8. The organic light emitting device of claim 7, wherein the passivation layer has the multi-layered structure alternately including an inorganic film and an organic film.

9. The organic light emitting device of claim 6, wherein the passivation layer having a multi-layered structure has a water vapor permeation rate that is more than 0 and equal to or less than $10^{-6}$ g/m$^2$ day.

10. The organic light emitting device of claim 5, wherein the passivation layer substantially has a thickness of 50 μm to 100 μm.

11. The organic light emitting device of claim 1, wherein the seal member substantially has a thickness of 1 mm to 5 mm.

12. The organic light emitting device of claim 1, wherein the size of the first substrate is larger than the size of the second substrate.

13. The organic light emitting device of claim 12, further comprising an adhesive positioned on the first substrate to cover the seal member and the second substrate.

14. The organic light emitting device of claim 1, further comprising a moisture absorbent positioned on an inter surface of at least one of the first substrate and the second substrate.

15. The organic light emitting device of claim 1, further comprising a moisture absorbent positioned in a predetermined area of the display unit.

* * * * *